United States Patent
Kimoto et al.

[11] Patent Number: 5,117,267
[45] Date of Patent: May 26, 1992

[54] SEMICONDUCTOR HETEROJUNCTION STRUCTURE

[75] Inventors: Tsunenobu Kimoto; Tadashi Tomikawa; Nobuhiko Fujita, all of Itami, Japan

[73] Assignee: Sumitomo Electric Industries, Ltd., Osaka, Japan

[21] Appl. No.: 588,823

[22] Filed: Sep. 27, 1990

[30] Foreign Application Priority Data

Sep. 27, 1989 [JP] Japan .................................. 1-251389
Oct. 4, 1989 [JP] Japan .................................. 1-259257

[51] Int. Cl.$^5$ .................. H01L 29/161; H01L 33/00; H01L 27/12; H01L 29/20
[52] U.S. Cl. .......................................... 357/16; 357/17; 357/4; 357/61
[58] Field of Search ........................... 357/16, 17, 4, 61

[56] References Cited

U.S. PATENT DOCUMENTS 3,142,595 7/1964 Wentorf, Jr. ........................ 148/33
4,875,967 10/1989 Mishima et al. ...................... 356/605
4,929,986 5/1990 Yoder ................................. 357/61

FOREIGN PATENT DOCUMENTS

WO8810007 12/1988 PCT Int'l Appl. .

OTHER PUBLICATIONS

Warren E. Pickett, "Thin Superlattices and Band-Gap Discontinuities: The (110) Diamond-Boron Nitride Interface", Physical Review B, vol. 38, No. 2, Jul. 15, 1988, pp. 1316-1322.

Primary Examiner—Mark Prenty
Attorney, Agent, or Firm—Cushman, Darby & Cushman

[57] ABSTRACT

A semiconductor heterojunction structure comprising a p-type diamond layer and an n-type cubic boron nitride layer on a surface of said p-type diamond layer. Such heterojunction structure is useful for a semiconductor device such as a diode, a transistor, a laser and a rectifier, particularly an element which emits light from blue light to ultraviolet light.

9 Claims, 8 Drawing Sheets

SEMICONDUCTOR HETEROJUNCTION STRUCTURE

BACKGROUND OF THE INVENTION

1. Field of the Invention

The present invention relates to a semiconductor heterojunction structure which can be used in a semiconductor device for a light emitting element which emits light from blue light to ultraviolet light.

2. Description of the Related Art

Diamond is a thermally and chemically stable material and has a wide forbidden band (5.5 eV) and a large electron mobility (2000 cm$^2$/V.sec). The diamond is widely used as an insulating material, and it will find a variety of applications when it is used as a semiconductive material.

The semiconductor diamond is strongly expected to be used in a device which can be used under a severe environment, a high speed device, a high power device or a blue light emitting element.

In order to utilize the diamond as a semiconductor element, a p- or n-type semiconductor having a low resistance should be obtained and a pn junction should be easily formed.

The semiconductor diamond is in the form of a natural bulk, a high-pressure synthesis bulk or a vapor phase deposition film.

The p-type diamond having a relatively low resistance can be prepared by doping boron (B) in the diamond.

The n-type diamond can be prepared by doping phosphorus (P) or lithium (Li) in the diamond, but it has a high resistance. The n-type diamond having a low resistance has not been prepared yet.

The diamond film prepared by the vapor phase deposition method is extremely expected so as to give a semiconductor diamond device. The vapor phase deposition method comprises exciting a feed gas, causing a vapor phase reaction around a heated substrate and depositing a reaction product on the substrate to form a thin film. A means for excitation includes heat, plasma, light and the like. The excitation by the plasma is classified as an RF grow discharge, or a microwave or direct current discharge according to a means which excites the plasma.

A single crystal diamond film having good quality can grow on a single crystal diamond substrate, particularly by a microwave plasma CVD method.

Currently, a Schottky diode is prepared by utilizing a junction between a metal such as W or Al and the p-type diamond prepared by the vapor phase deposition. FIG. 1 is a sectional view of a Schottky diode having a p-type diamond layer. In FIG. 1, a p-type diamond layer 102 is provided on an insulative diamond substrate 101. A tungsten electrode 103 and titanium electrodes 104 are provided on the p-type diamond layer 102.

A pn junction consisting of the diamond has not been prepared yet.

A semiconductor light emitting element such as a light emitting diode (LED) or a semiconductor laser (LD) has good properties such as high reliability, a high speed and a small size.

The LEDs emitting the light from infrared light to visible light have been developed. The infrared light LED is an essential device in the fields of an optical communication and an optical information processing. The visible light LED is an essential device for various display elements.

Among the visible light LEDs, the red light LED is prepared from GaP (Zn, O), AlGaAs or GaAsP, the yellow light LED is prepared from GaAsP (N) and the green light LED is prepared from GaP (N).

The most important subject of the semiconductor light emitting device is to develop a blue light LED.

The visible light LED which emits the light having wavelength longer than green light has been developed, but the blue light LED has not been developed yet. Then, the color display which has picture elements consisting of LEDs has not been realized.

If the blue light LED having high luminance is developed, a display having a high speed, good control and high reliability or a very thin display can be assembled.

A material having a wide forbidden band (Eg>2.6 eV) is necessary to realize the blue light LED. It is desired that a direct transition and p- or n-type semiconductor having low resistance is prepared from such material.

Currently, a crystal of GaN, 6H-SiC, ZnS, ZnSe or the like is being researched for the blue light emitting element and LEDs are manufactured by way of trial.

However, each of GaN, ZnS and ZnSe does not give the p-type semiconductor having low resistance. Then, good pn junction cannot be formed.

6H-SiC is a most promising material. But it is of a indirect transition type and has low conversion efficiency. Each known material has advantages and disadvantages, and the blue light LED having the high luminance has not been realized.

It is reported that the luminance of 12 mcd was achieved with a light emitting diode prepared by using 6H-SiC. This value is the highest value in a laboratory level.

SUMMARY OF THE INVENTION

An object of the present invention is to form a pn junction comprising the diamond with good properties.

Another object of the present invention is to provide a light emitting element which has a pn junction comprising the diamond.

These and other objects are achieved by a semiconductor heterojunction structure comprising a p-type diamond layer and an n-type cubic boron nitride layer on a surface of said p-type diamond layer.

DETAILED DESCRIPTION OF THE INVENTION

Figure 1:
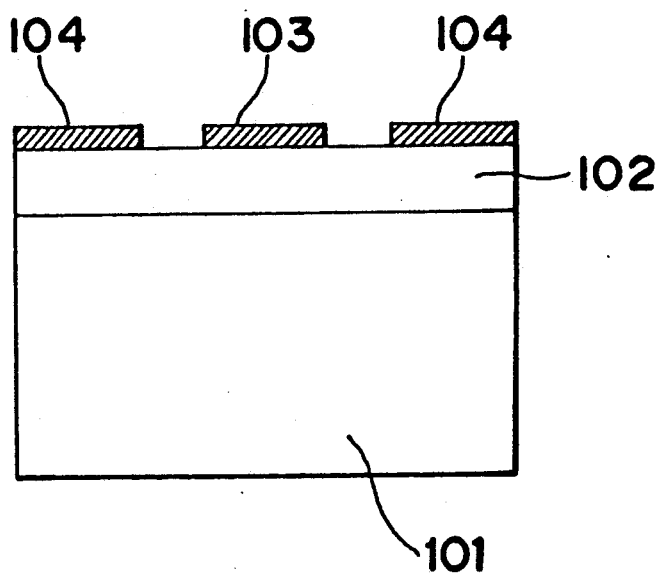
FIG. 1 is a schematic sectional view of a conventional diode having a p-type diamond layer.

The heterojunction structure according to the present invention may comprise an n-type cubic boron nitride (c-BN) substrate and a p-type diamond layer on the n-type c-BN substrate.

The heterojunction structure according to the present invention may comprise a p-type diamond substrate and an n-type c-BN layer on the p-type diamond substrate.

The heterojunction structure according to the present invention may comprise a p-type diamond layer and an n-type c-BN layer both on a substrate. The substrate may be made of a metal or silicon. This structure has the p-type diamond layer (first layer) on the substrate and the n-type c-BN layer (second layer) on the first layer, or has the n-type c-BN layer (first layer) on the substrate and the p-type diamond layer (second layer) on the first layer. Ohmic contact should be formed between the substrate and the first layer.

The thickness of the p-type diamond layer is from 0.01 to 100 $\mu$m. The thickness of the n-type c-BN layer is from 0.01 to 100 $\mu$m.

The heterojunction structure of the present invention gives a pn junction.

Cubic boron nitride (c-BN) has a wide forbidden band (about 7.5 eV) and it can be doped to prepare p- and n-type semiconductors. Then, the pn heterojunction having the wide forbidden band can be realized by contacting the p-type diamond with n-type c-BN.

Boron nitride (BN) has properties similar to those of the diamond. Carbons are in the form of the diamond when they are in cubic diamond structure, and in many cases they are in hexagonal structure and in the form of the graphite. An amorphous carbon film can be also prepared.

Boron nitride (BN) can have the following structures:

(1) c-BN (cubic boron nitride)

(2) Hexagonal BN

This structure has a hexagonal crystal structure and the hexagonals stratify.

(3) t-BN (turbulent layer structure)

B and N are bonded locally, but do not form crystal structure. This structure is one in which the hexagonal structure is further disordered.

(4) a-BN (amorphous)

BN can be amorphous according to the temperature of a substrate.

As described above, BN can have various structures and give various products according to a preparation method, a temperature and a pressure. When a thin film of BN is prepared, Si or a metal can be used as a substrate. Although hexagonal BN is prepared in many cases, cubic boron nitride (c-BN) can be prepared when preparation conditions are selected. When carbon (C) is compared with boron nitride (BN), hexagonal BN corresponds to the graphite and c-BN corresponds to the diamond in view of the structure.

C-BN has good environmental resistance like the diamond and its hardness is next to the diamond.

C-BN is not a naturally occurring material and is artificially prepared. A hollow cathode discharge method, a reactive ion beam plating method, a reactive pulse plasma method and the like are proposed as the methods of preparing c-BN. C-BN can be doped to give both n-type and p-type semiconductors. For n-type c-BN, for example, silicon or sulfur can be doped. For p-type c-BN, for example, beryllium can be doped.

When the p-type diamond is contacted with c-BN, properties of an interface between the diamond and c-BN are important.

The diamond has a diamond crystal structure having a lattice constant of 3.567 Å and c-BN has a zincblende crystal structure having a lattice constant of 3.615 Å. Difference of lattice constant is 1.3% and small. When one of two kinds of elements in the zincblende crystal structure are replaced with the other element, the diamond crystal structure is obtained. Since the difference of the lattice constant is small and the structure of the diamond is similar to that of c-BN, good interface properties are realized in the junction of the diamond and c-BN.

Figure 2C:
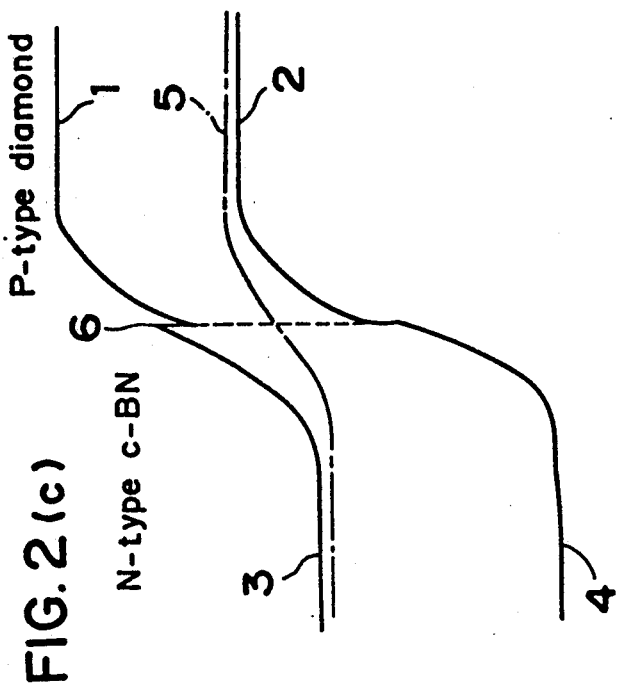
FIGS. 2A-2C are a band scheme of a heterojunction structure according to the present invention comprising a p-type diamond layer and an n-type cubic boron nitride layer.
Figure 2A:
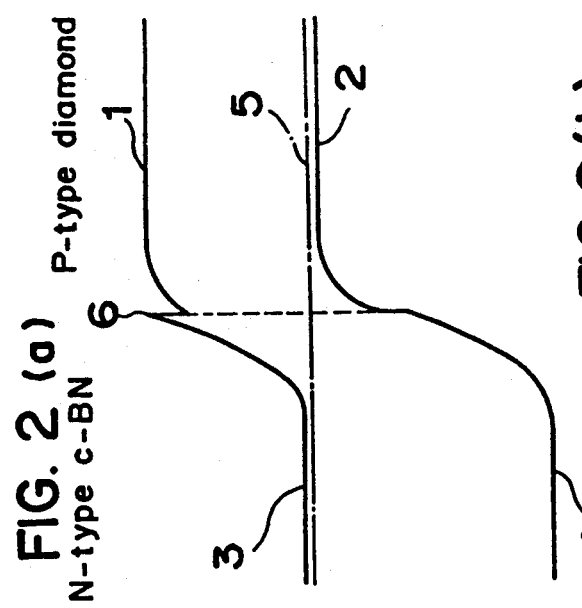
Figure 2B:
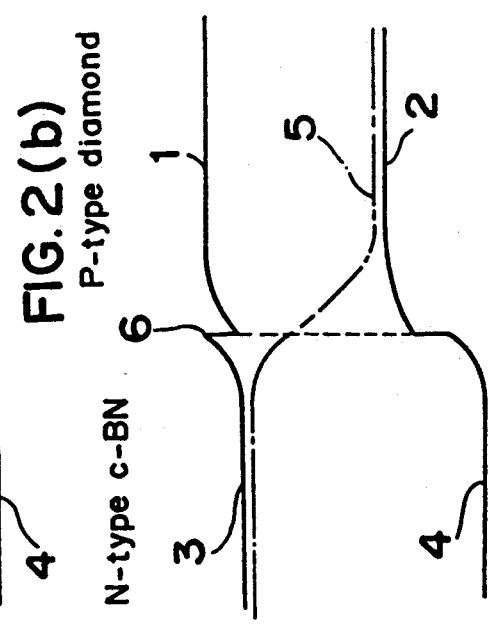

FIG. 2 is a band scheme of the pn heterojunction comprising p-type diamond and n-type c-BN.

A right side is the p-type diamond and a left side is n-type c-BN. A conduction band 1 and a valence band 2 of the p-type diamond curve downward near a heterojunction interface 6. A conduction band 3 and a valence band 4 of n-type c-BN curve upward near the heterojunction interface 6.

A Fermi level 5 is close to the valence band 2 in the p-type diamond and also to the conduction band 3 in n-type c-BN. In FIG. 2, (a) is a band scheme with zero bias, (b) is a band scheme with forward bias and (c) is a band scheme with reverse bias.

In case of the zero bias, the Fermi level 5 is at the constant height. Since c-BN has a wider forbidden band than the diamond, discontinuity of the band appears at the heterojunction interface 6.

In case of the forward bias, a positive voltage is applied to the p-type diamond and a negative voltage is applied to n-type c-BN. Then the Fermi level rises in the n-type c-BN side, level differences between the conduction bands 1 and 3 and between valence bands 2 and 4 decrease as shown in (b). An electric current passes from the right to the left. Positive holes are injected from the p-type diamond to n-type c-BN. Electrons are injected from n-type c-BN to the p-type diamond. Electrons and positive holes recombine near the junction interface due to the light-emitting or non-light-emitting transition. A width of a depletion layer becomes narrow.

In case of the reverse bias, a negative voltage is applied to the p-type diamond and a positive voltage is applied to n-type c-BN. The Fermi level rises in the p-type diamond side as shown in (c). A barrier against a carrier becomes high, and the electric current is restricted. The width of the depletion layer becomes wide.

By preparing the pn heterojunction comprising the p-type diamond and n-type c-BN as described above, (1) rectification and (2) control of the depletion layer width with bias are advantageously achieved.

In addition, properties which are specific in the heterojunction are exhibited.

Hitherto, the junction of the semiconductors having such wide forbidden band has not been reported yet.

In the most preferred embodiment, the semiconductor heterojunction structure of the present invention further has a p-type cubic boron nitride layer on one surface of the p-type diamond layer which is opposite to the surface of the p-type diamond layer contacting with the n-type cubic boron nitride layer. Namely, this semiconductor heterojunction structure comprises a p-type diamond layer, an n-type cubic boron nitride layer on one surface of the p-type diamond layer and a p-type cubic boron nitride layer on the other surface of the p-type diamond layer. This heterojunction structure is an n-type c-BN/p-type diamond/p-type c-BN structure, namely a double hetero (DH) junction structure.

The double heterojunction structure may have a p-type diamond layer on a p-type c-BN substrate and an n-type c-BN layer on the p-type diamond layer, or may have a p-type diamond layer on an n-type c-BN substrate and a p-type c-BN layer on the p-type diamond layer. The double heterojunction structure may have a p-type c-BN layer on one surface of a p-type diamond substrate and an n-type c-BN layer on the other surface of the substrate. The p-type and n-type c-BN substrates and the p-type diamond substrate can be prepared by a high-pressure synthesis or a vapor phase deposition. Alternatively, the double heterojunction structure may have a p-type c-BN layer, a p-type diamond layer and an n-type c-BN layer on a substrate. The substrate is made of, for example, p-type diamond. The thickness of the p-type c-BN layer is from 0.01 to 100 $\mu$m.

Figure 3:
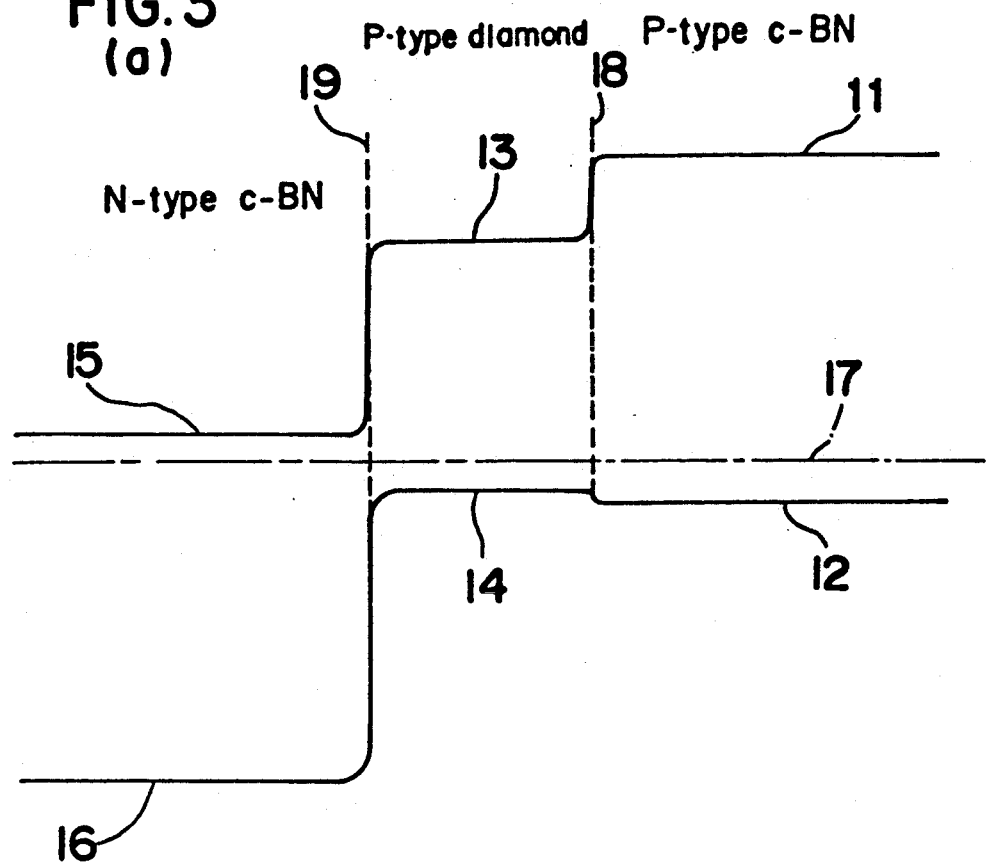
FIGS. 3A and 3B are a band scheme of a heterojunction structure according to the present invention comprising a p-type cubic boron nitride layer, a p-type diamond layer and an n-type cubic boron nitride layer.
Figure 3:
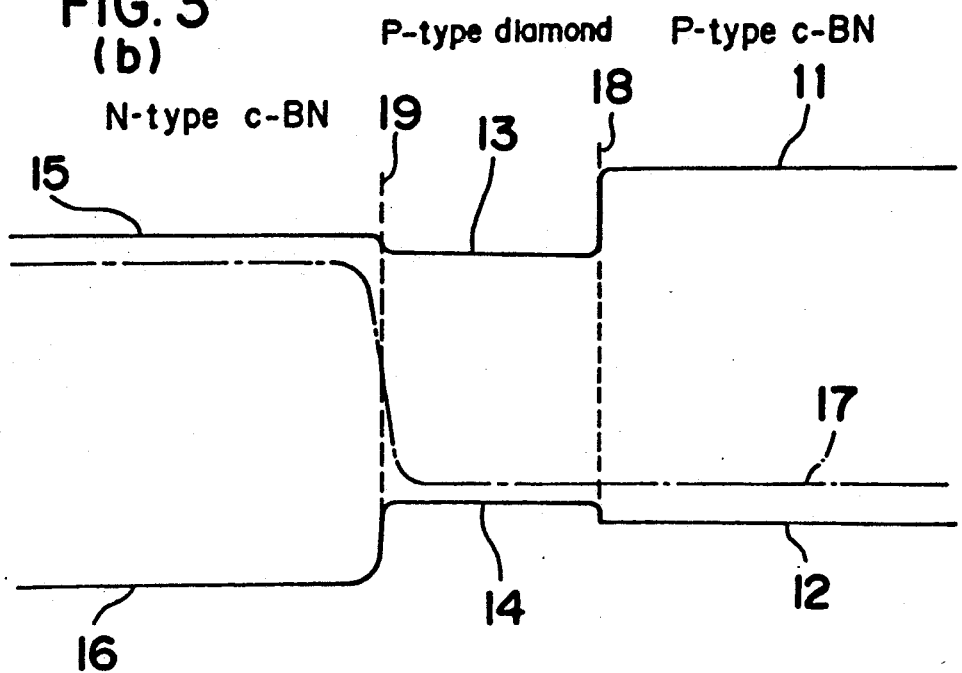

FIG. 3 is a band scheme of the double heterojunction structure of n-type c-BN/p-type diamond/p-type c-BN.

The right side is p-type c-BN, the center is the p-type diamond and the left side is n-type c-BN. In FIG. 3, (a) is the band scheme with zero bias and (b) is the band scheme with forward bias. In p-type c-BN, a Fermi level 17 is present between a conduction band 11 and a valence band 12. At a junction interface 18, a conduction band 13 and a valence band 14 of the p-type diamond continue from the conduction band 11 and the valence band 12 respectively.

Since c-BN has a wider forbidden band than the diamond, the conduction band 13 of the p-type diamond is slightly lower than the conduction band 11 of p-type c-BN. The valence band 14 of the p-type diamond is slightly higher than the valence band 12 of p-type c-BN.

At an interface 19, a conduction band 15 and a valence band 16 of n-type c-BN continue from the conduction band 13 and the valence band 14 of the p-type diamond respectively. Since the interface 19 is a pn junction interface, the discontinuity of the conduction and valence bands are significant. In case of the zero bias, bands of p-type c-BN, p-type diamond and n-type c-BN are stepwise.

In case of the forward bias, bands of n-type c-BN are lifted up at the pn junction interface 19. In FIG. 3 (b), the electrons are injected from n-type c-BN to the p-type diamond. Since the forbidden band of the diamond is narrow, these electrons are effectively confined in the conduction band 13. Positive holes in the p-type diamond are confined in the valence band 14 of the diamond due to heterojunction barriers of both sides.

By the heterojunction structure according to the present invention, an element which emits light from blue light to ultraviolet light having the high luminance can be provided because of the following factors.

1) Since the pn junction is formed, the injection of a minority carrier is significantly promoted with forward bias. This injection of the minority carrier is one of the most important conditions for the semiconductor light emission. By the injection of the minority carrier, recombination of electrons and positive holes having light emission property occurs near the pn junction and the blue light is emitted.

Although the conventional diamond Schottky diode may emit light with forward bias, the luminance is significantly low. This is because, in the Schottky junction, the current is mainly transferred by a majority carrier and the injection of the minority carrier is extremely little. In the present invention, the recombination of electrons and positive holes occurs in the diamond near the heterojunction interface due to the injection of the minority carrier and then strong light emission occurs.

2) Because of the heterojunction, holes are confined in the diamond region which has a narrow forbidden band. Therefore, light emitting recombination of holes with electrons which are injected from the n-type c-BN region to the p-type diamond region significantly increases.

3) In the double heterojunction structure, since the refractive index of the diamond (2.42) is larger than the refractive index of c-BN (2.12), the light is also confined in the diamond region. This is an effective property, particularly in the case of a Fabry-Perot type light emitting element.

Because of the above-described reasons, the element which emits the light from the blue light to the ultraviolet light having the high luminance can be produced.

The application of the heterojunction structure according to the present invention is not limited to the light emitting element. The heterojunction structure according to the present invention can be applied to various semiconductor devices such as a diode, a transistor, a laser and a rectifier. The transistor is for example, a bipolar transistor and MIS FET. Since the diamond and c-BN have high mechanical strength and good thermal resistance and the diamond has a large carrier mobility, the present invention can provide the semiconductor device having good environmental resistance, good thermal resistance, high power and high speed.

Now, the present invention is explained by the following examples.

EXAMPLE 1

In this example, a pn junction diode is explained as one of the applications of the heterojunction having the n-type c-BN/p-type diamond structure.

A p-type diamond layer (Boron-doped, Resistivity: 20 ohm.cm, Thickness: 1 $\mu$m) was grown on an n-type c-BN substrate (Silicon-doped, Resistivity: $10^3$ ohm.cm, Size: 1 mm×2 mm, Thickness: 500 $\mu$m) prepared by a high-pressure synthesis.

An electrode made of AuSi was provided on a back surface of the n-type c-BN substrate. An electrode made of titanium was provided on a top surface of the p-type diamond layer.

Figure 4:
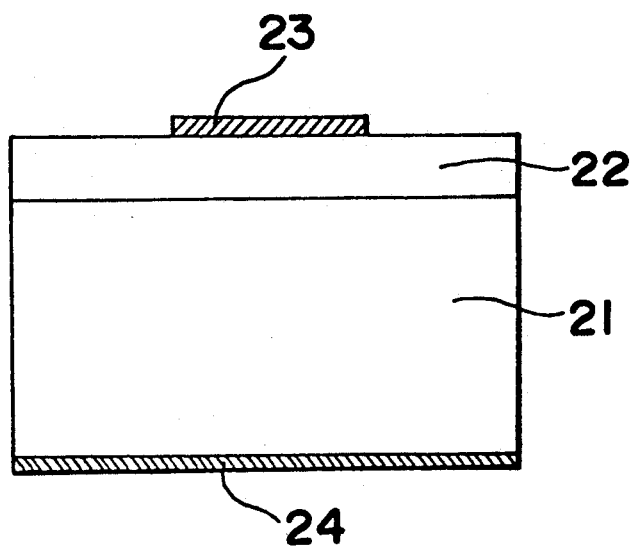
FIG. 4 is a schematic sectional view of a diode of Example 1.

A sectional view of this pn heterojunction diode is shown in FIG. 4. A p-type diamond layer 22 is present on an n-type c-BN substrate 21. An AuSi electrode 24 is provided on a back surface of the n-type c-BN substrate 21. A Ti electrode 23 is provided on the p-type diamond layer 22. These electrodes are ohmically connected.

The p-type diamond layer 22 was formed on the c-BN substrate 21 by a microwave plasma CVD method. The growing conditions were as follows:

Feed gases: $CH_4$, $H_2$, $B_2H_6$
$CH_4$ concentration: 6%
B/C: 150 ppm

Gas pressure: 40 Torr
Substrate temperature: 900° C.
Microwave power: 350 W

The Ti and AuSi electrodes were formed by a vapor deposition method.

Figure 5:
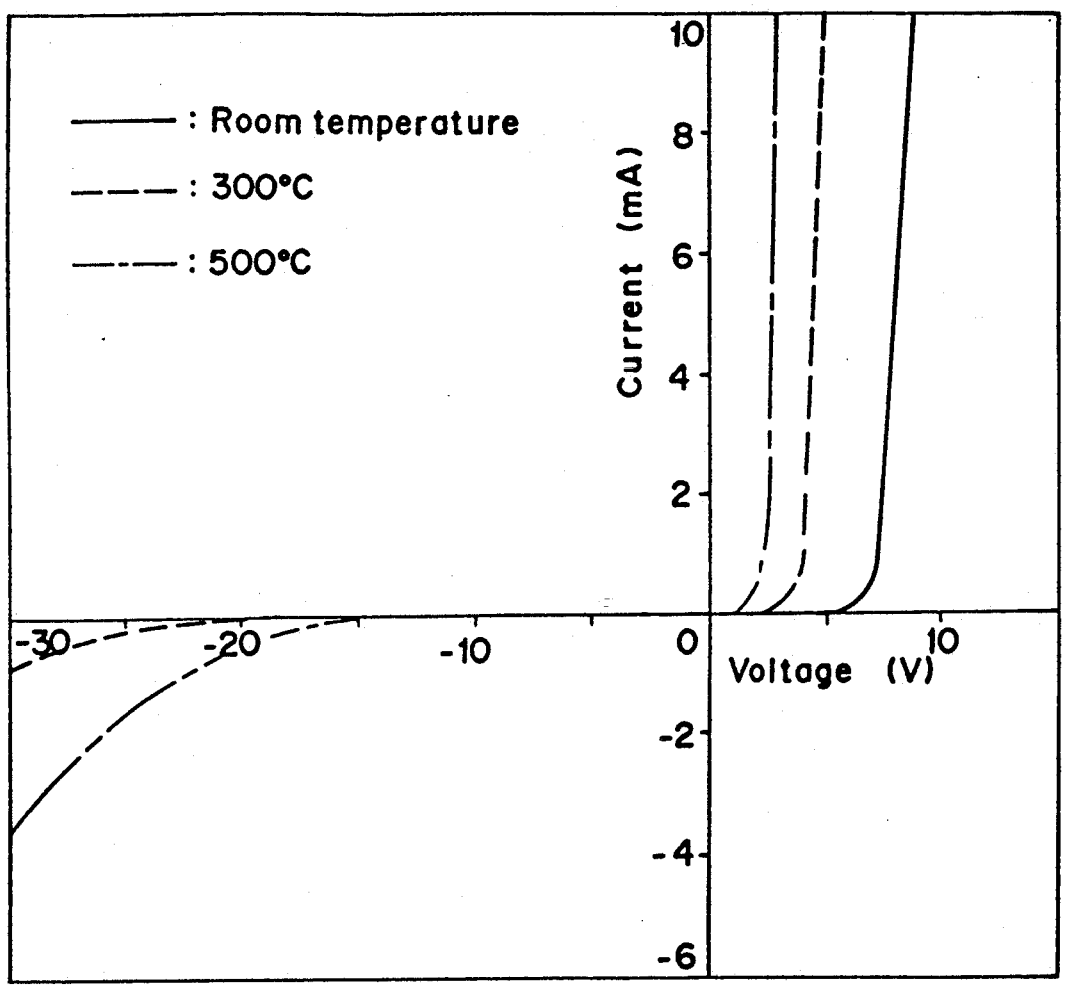
FIG. 5 is a graph showing a relationship between a current and a voltage in the diode of Example 1.

A relationship between a current and a voltage of this heterojunction diode was measured. The result is shown in FIG. 5. The voltage is positive when the Ti electrode has a positive polarity and the AuSi electrode has a negative polarity. An axis of abscissa represents the voltage (V) and an axis of ordinate represents the current (mA). A solid line, a broken line and an alternate long and short dash line represent the results obtained at room temperature, 300° C. and 500° C., respectively.

This pn junction diode exhibited good diode properties. In particular, sufficient rectification was achieved at high temperature such as 500° C. This diode is a high-temperature operating device which has not achieved in the past.

When the voltage was applied in the forward direction of the heterojunction diode, the current flowed in the forward direction, and the blue light was emitted. The blue light emission is due to the wide forbidden band.

Figure 6:
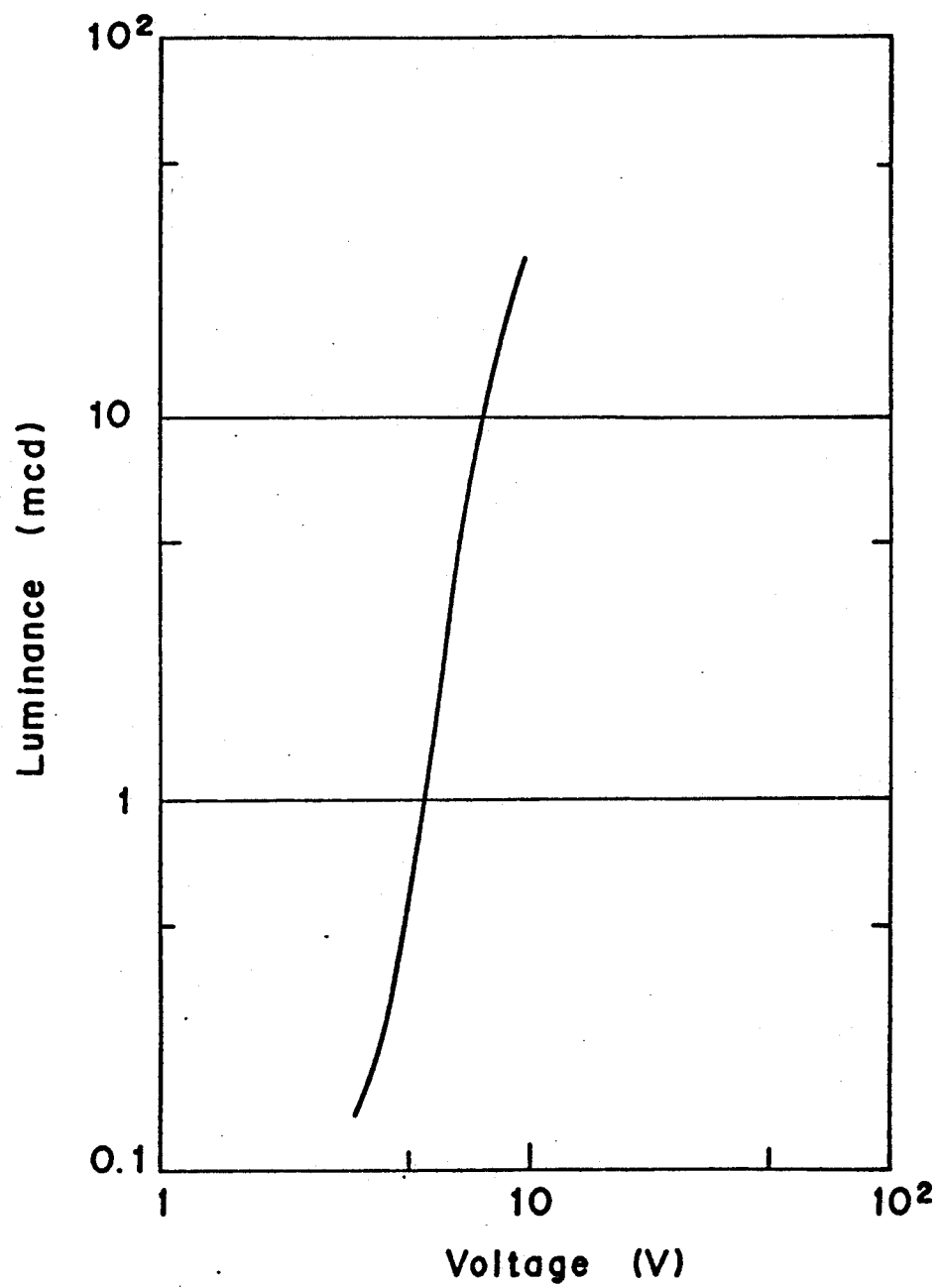
FIG. 6 is a graph showing a relationship between an applied voltage and luminance, which is observed in the diode of Example 1.

FIG. 6 is a graph showing a relationship between an applied voltage and luminance. Spectra of the blue light emission had a peak near 440 nm. The light emission began at the applied voltage of about 4 V. When 8 V is applied at room temperature, the high luminance of 15 to 20 mcd was achieved. This luminance is higher than the highest reported value (12 mcd, 6H-SiC LED) of the blue light emission diode.

EXAMPLE 2

A p-type diamond layer (Boron-doped, Resistivity: 20 ohm.cm, Thickness: 0.5 μm) was grown on a p-type c-BN substrate (Beryllium-doped, Resistivity: $5 \times 10^2$ ohm.cm, Size: 1 mm×2 mm, Thickness: 500 μm) prepared by a highpressure synthesis. Then, an n-type c-BN layer (Silicondoped, Resistivity: 10 ohm.cm, Thickness: 0.7 μm) was grown on the p-type diamond layer to give a double heterojunction structure. An AuBe electrode was provided on a back surface of the p-type c-BN substrate and an AuSi electrode was provided on a top surface of the n-type c-BN layer to prepare a diode.

Figure 7:
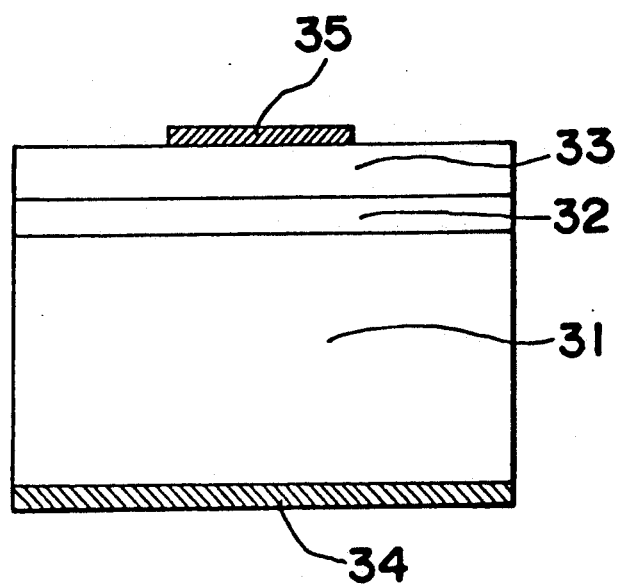
FIG. 7 is a schematic sectional view of a diode of Example 2.

A sectional view of this double heterojunction diode is shown in FIG. 7. A p-type diamond layer 32 is present on a p-type c-BN substrate 31. An n-type a-BN layer 33 is present on the p-type diamond layer 32. An AuSi electrode 35 is provided on a top surface, and an AuBe electrode 34 is provided on a bottom surface.

The p-type diamond layer was prepared by a microwave plasma CVD method. The growing conditions were as follows:
Feed gases: $CH_4$, $H_2$, $B_2H_6$
$CH_4$ concentration: 6%
B/C: 150 ppm
Gas pressure: 40 Torr
Substrate temperature: 900° C.
Microwave power: 350 W The n-type c-BN layer was prepared by an activating reactive vapor deposition method using an HCD (hollow cathode discharge) gun. The growing conditions were as follows:
Feed materials: solid boron, $N_2$, $H_2$, $SiH_4$
Substrate temperature: 600° C.
HCD gun: 20 V, 85A
Substrate bias voltage: −120 V The AuBe electrode and the AuSi electrode were prepared by a vacuum deposition method.

Figure 8:
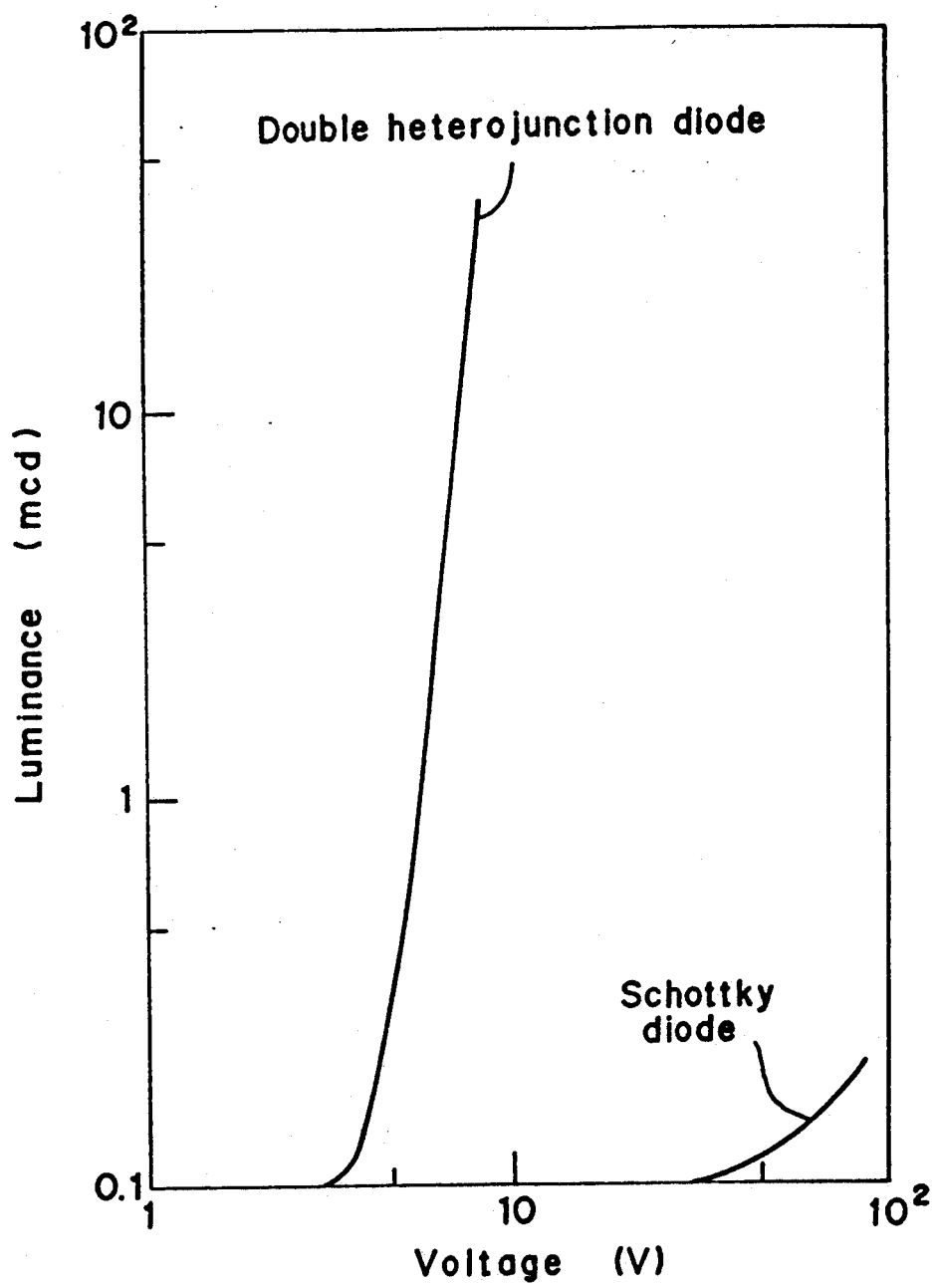
FIG. 8 is a graph showing a relationship between a driving voltage and luminance, which is observed in the diode of Example 2 and the Schottky junction diode of FIG. 1.

When the current was flowed in the forward direction of the diode prepared as described above, the blue light emission having a peak near 440 nm was observed. A relationship between a driving voltage and luminance is shown in FIG. 8. An axis of abscissa represents the driving voltage (V) and an axis of ordinate represents luminance (mcd). In FIG. 8, a light emission property of the Schottky junction diode having the p-type diamond and tungsten of FIG. 1 is also shown in addition to the double heterojunction diode of the present invention.

In the case of the Schottky junction diode, when the driving voltage is 50 to 100 V, the luminance is only 0.1 to 0.3 mcd.

In the case of the double heterojunction diode according to the present invention, the light emission begins at the driving voltage of 4 V and the luminance is 20 to 30 mcd at the driving voltage of 7 V. This value is two or three times the highest luminance (12 mcd) of the blue light emission achieved by a conventional 6H-SiC LED.

The reason why the high luminance is achieved at the low driving voltage may be that the pn junction is formed and the carrier and light are effectively confined due to the double heterojunction structure.

Higher luminance and lower driving voltage may be achieved by improving the crystallinity of each layer or optimizing the element structure.

Ultraviolet light emission having the wavelength longer than 280 nm was observed in the light emitting diode of this Example. Therefore, when the preparation process and the element structure are optimized, an ultraviolet light LED can be developed from the light emitting element of the present invention. For example, the short wavelength light emission can be achieved since an emission center is prepared by doping an impurity in the diamond, or an emission center is prepared by radiating the diamond with an electron beam to form vacant lattice points and combining the vacant lattice points with an impurity.

What is claimed is:

1. A semiconductor heterojunction structure comprising:
   a p-type diamond layer;
   an n-type cubic boron nitride layer on a first surface of said p-type diamond layer; and
   a p-type cubic boron nitride layer on a second surface of the p-type diamond layer, said second surface being opposite said first surface.

2. The semiconductor heterojunction structure according to claim 1, which comprises a p-type diamond layer on a p-type cubic boron nitride substrate and an n-type cubic boron nitride layer on the p-type diamond layer.

3. The semiconductor heterojunction structure according to claim 1, which comprises a p-type diamond layer on an n-type cubic boron nitride substrate and a p-type cubic boron nitride layer on the p-type diamond layer.

4. The semiconductor heterojunction structure according to claim 1, which comprises a p-type cubic boron nitride layer on one surface of a p-type diamond substrate and an n-type cubic boron nitride layer on the other surface of the substrate.

5. The semiconductor heterojunction structure according to claim 1, which comprises a p-type cubic boron nitride layer, a p-type diamond layer and an n-type cubic boron nitride layer on a substrate.

6. A light emitting element having a semiconductor heterojunction structure comprising:
   a p-type diamond layer;
   an n-type cubic boron nitride layer on a first surface of said p-type diamond layer; and
   a p-type cubic boron nitride layer on a second surface of the p-type diamond layer, said second surface being opposite said first surface.

7. The light emitting element according to claim 6, wherein the p-type cubic boron nitride layer is used as a substrate;
   wherein the p-type diamond layer is disposed on the p-type cubic boron nitride substrate; and
   wherein the n-type cubic boron nitride layer is disposed on the p-type diamond layer.

8. The light emitting element according to claim 6, wherein the n-type cubic boron nitride layer is used as a substrate;
   wherein the p-type diamond layer is disposed on the n-type cubic boron nitride substrate; and
   wherein the p-type cubic boron nitride layer is disposed on the p-type diamond layer.

9. The light emitting element according to claim 6, further comprising a substrate on which said p-type cubic boron nitride layer, said p-type diamond layer, and said n-type cubic boron nitride layer are formed.

* * * * *